United States Patent [19]
Taniyama et al.

[11] Patent Number: 5,632,820
[45] Date of Patent: May 27, 1997

[54] THERMAL TREATMENT FURNACE IN A SYSTEM FOR MANUFACTURING SEMICONDUCTORS

[75] Inventors: Tomoshi Taniyama; Hideki Kaihotsu; Yoshikatsu Kanamori; Kazuhito Ikeda; Shuji Yonemitsu, all of Tokyo, Japan

[73] Assignee: Kokusai Electric Co., Ltd., Japan

[21] Appl. No.: 425,924

[22] Filed: Apr. 20, 1995

[30] Foreign Application Priority Data

Jan. 12, 1995 [JP] Japan ................................... 7-019758

[51] Int. Cl.$^6$ ................................................ C23C 16/00
[52] U.S. Cl. .......................... 118/724; 118/715; 118/733; 432/241; 432/242
[58] Field of Search ........................... 118/715, 724, 118/725, 733; 432/241, 242

[56] References Cited

U.S. PATENT DOCUMENTS

| | | | |
|---|---|---|---|
| 4,067,697 | 1/1978 | Polaschegg | 23/259 |
| 4,256,052 | 3/1981 | Johnson | 118/719 |
| 4,436,509 | 3/1984 | Kocmanek | 432/253 |
| 4,943,235 | 7/1990 | Nakao | 432/205 |
| 5,118,286 | 6/1992 | Sarin | 432/2 |
| 5,121,705 | 6/1992 | Sugino | 118/719 |
| 5,127,365 | 7/1992 | Koyama | 118/724 |
| 5,248,378 | 9/1993 | Oda | 156/617.1 |
| 5,303,671 | 4/1994 | Kondo | 118/719 |
| 5,320,127 | 6/1994 | Yanagihara | 137/72 |
| 5,352,248 | 10/1994 | Ishikawa | 29/25.01 |
| 5,359,148 | 10/1994 | Okase | 118/724 |
| 5,362,229 | 11/1994 | Yamaga | 432/152 |
| 5,368,648 | 11/1994 | Sekizuka | 118/733 |
| 5,378,283 | 1/1995 | Ushikaw | 118/719 |
| 5,433,784 | 7/1995 | Miyagi | 118/715 |
| 5,443,648 | 8/1995 | Ohkase | 118/724 |
| 5,445,521 | 8/1995 | Yamaguchi | 432/5 |
| 5,445,522 | 8/1995 | Miyagi | 432/156 |
| 5,536,320 | 7/1996 | Ushikawa | 118/719 |

FOREIGN PATENT DOCUMENTS

| | | | |
|---|---|---|---|
| 62-290126 | 12/1987 | Japan . | |
| 3-39834 | 4/1991 | Japan . | |
| 4-207019 | 7/1992 | Japan . | |
| 196523 | 7/1992 | Japan | 118/724 |
| 269824 | 9/1992 | Japan | 118/724 |
| 269825 | 9/1992 | Japan | 118/724 |
| 306824 | 10/1992 | Japan | 118/724 |
| 7-6965 | 1/1995 | Japan . | |

*Primary Examiner*—Richard Bueker
*Assistant Examiner*—Jeffrie R. Lund
*Attorney, Agent, or Firm*—Graham & James LLP

[57] ABSTRACT

A thermal treatment furnace for use with a semiconductor system is provided. The thermal treatment furnace includes a scavenger which sealingly encloses a lower end of a reaction tube so as to diminish gas leakage from the reaction tube.

10 Claims, 5 Drawing Sheets

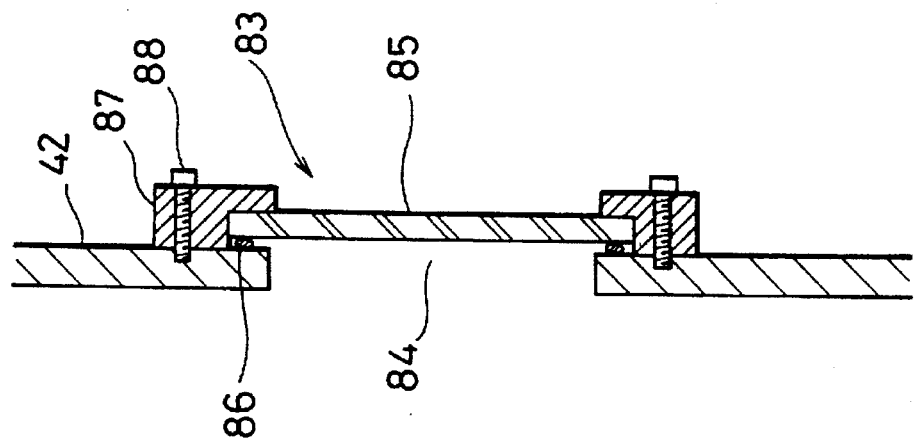
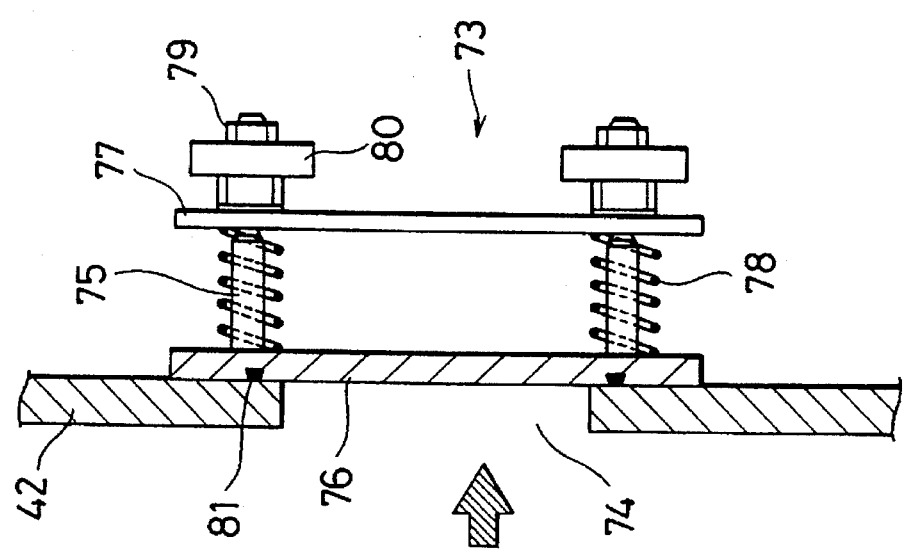

THERMAL TREATMENT FURNACE IN A SYSTEM FOR MANUFACTURING SEMICONDUCTORS

BACKGROUND OF THE INVENTION

The present invention relates to a thermal treatment furnace in a system for manufacturing semiconductors, in which an object to be treated, such as a silicon wafer substrate, undergoes various processes such as diffusion and hydrogen annealing.

The pre-treatment in the manufacture of semiconductors involves various processes such as diffusion treatment, chemical vapor deposition (CVD) and hydrogen annealing. Such pre-treatment is performed in thermal treatment furnaces. Of these, hot treatment furnaces such as vertical diffusion furnaces and furnace annealors are utilized particularly for heat treating the object at a high temperature therein.

In such hot treatment furnaces, recovery of the treated object from damage and degradation caused by ion implanters, fellow of phosphorus diffusion layer and hydrogen annealing are achieved.

Referring now to FIG. 6, a known semiconductor production arrangement with a hot treatment furnace will be described briefly.

As illustrated, a through aperture 2 extends through a heater base 1. On the underside of the heater base 1, a liner tube support plate 3 of a doughnut shape is disposed concentrically with the aperture 2. An annular seat 19 of a heat insulating material is placed upon the upper surface of the liner tube support plate 3 at the inner edge of the aperture 2. On the heater base 1, a heater chamber 4 is disposed about the aperture 2. Within the heater chamber 4, a cylindrical heater 5 extends upwardly from the heater base 1 concentrically with the aperture 2. Concentrically disposed in order within the heater 5 are a liner tube 6 and a reaction tube 7, the liner tube 6 extending upwardly from the annular seat 19 and the reaction tube 7 extending upwardly from a reaction tube support member (not shown) with its lower end extending beyond the heater 5.

Running along the exterior wall of the reaction tube 7 is a gas injection pipe 8, one end of which is open to the ceiling of the reaction tube 7 and the other end of which is slidingly connected to a gas supply pipe 9 proximate to the lower end of the reaction tube 7. Provided at the lower end of the reaction tube 7 is an exhaust nozzle 10 which is connected slide fit to an exhaust pipe 11.

A boat 17 carrying thereon a wafer 16 is introduced into the reaction tube 7 and is movable upwardly and downwardly via a boat elevator not shown. The boat 17 is vertically positioned, by means of a boat support jig 13, upon a sealing cap 12 covering the lower end opening of the reaction tube 7. The sealing cap 12 is disposed on a boat elevator not shown. Along the peripheral edge of the sealing cap 12, a seal ring 18 is provided to achieve a sealed connection between the sealing cap 12 and the lower end of the reaction tube 7.

The lower end opening (furnace entry port) of the heater 5 and the exposed lower end of the reaction tube 7 are covered by a scavenger 14 which is in communication with an exhaust duct 15.

When the inside of the reaction tube 7 is heated to a predetermined temperature by the heater 5, the boat 17 carrying the wafer 16 thereon is introduced into the reaction tube 7. Then, a reactive gas such as a hydrogen gas is introduced into the reaction tube 7 through the gas supply pipe 9 and the gas injection pipe 8 to thereby do heat treatment of the wafer 16. After the treatment, an exhaust gas is exhausted through the exhaust nozzle 10 and the exhaust pipe 11.

The scavenger 14 serves to cut off radiant heat radiated from the entry port of the heater 5 and to capture particles generated at the furnace entry port, and to capture gas leaked from the connection between the gas injection pipe 8 and the gas supply pipe 9, from the connection between the exhaust nozzle 10 and the exhaust pipe 11 and from the junction between the sealing cap 12 and the reaction tube 7 to cause them to be exhausted through the exhaust duct 15 outside the arrangement.

The scavenger 14 is provided with openings for allowing insertion of the gas supply pipe 9 and the exhaust pipe 11, leaves a gap at the mount portion with respect to the heater base 1 and has a lower end opening for allowing upward and downward movement of the sealing cap 12, producing insufficient sealing effect thereat. As a result, it is not possible to completely capture the gas leaked from the connection between the gas injection pipe 8 and the gas supply pipe 9, the connection between the exhaust nozzle 10 and the exhaust pipe 11, and the junction between the sealing cap 12 and the reaction tube 7, as mentioned above, resulting in leakage of the gas outside the scavenger 14. Further, since sealing between the sealing cap 12 and the lower end of the reaction tube 7 is obtained by use of a single sealing ring 18, it is possible that gas will leak out from such sealed portion.

Thus, it was possible that on certain conditions, explosion of the leaked hydrogen gas will occur during the heat treatment of the wafer in the reaction tube into which hydrogen is introduced. It was also possible that when the reactive gas is of high acidity, the metal portions of the arrangement will corrode. Moreover, the leaked gas will deteriorate the working conditions.

SUMMARY OF THE INVENTION

It is an object of the invention to surely prevent leakage of gas from the reaction tube, as well as diffusion of gas leaked from the reaction tube and its associated parts, thereby avoiding adverse effects resulting from the leaked gas.

It is another object of the invention to prevent the system from being damaged by a possible explosion where the reactive gas is an explosive gas.

These objects are met by a semiconductor production system with a thermal treatment furnace according to the invention. In one aspect, the thermal treatment furnace of the invention comprises a scavenger which sealingly encloses the lower end portion of the reaction tube. In another aspect, the furnace includes a heater vertically disposed on a heater base, a reaction tube disposed within the heater, a gas supply pipe and an exhaust pipe communicating with the lower end, projecting beyond the heater, of the reaction tube, and a scavenger disposed on the underside of a heater base and sealingly enclosing the lower end portion of the reaction tube. In a further aspect, it includes a boat support jig on which a boat for supporting a wafer thereon is disposed vertically, the boat support jig covering an opening of the reaction tube air-tight. In a further aspect, it includes a gas supply pipe extending through the reaction tube and an exhaust pipe communicating with the reaction tube and extending through the heater base respectively, the openings through which they extend being sealed. In a still further aspect, the furnace includes a reactive gas transmission pipe having a flange at its top end, a reactive gas introduction nozzle, disposed closely to the reaction tube, having a flange, the two flanges being joined together in an air-tight fashion by means of a seal sandwiched therebetween, an exhaust pipe having a flange at its top end and an exhaust nozzle, disposed closely to the reaction tube, having a flange, the latter two flanges being joined together in an air-tight fashion by means of a seal sandwiched therebetween. In a still further aspect, it is arranged such that an inert gas is supplied through an appropriate position of the scavenger and exhausted through a different position. In a still further aspect, the scavenger includes an explosion-proof valve disposed thereon. In a still further aspect, the scavenger includes a view port disposed thereon. In a still further aspect, the furnace includes at least two pairs of lock mechanisms disposed in the vicinity of a sealing cap closing the opening of the reaction tube. In a still further aspect, the reaction tube includes flanges formed at its entry port side edge, which are joined together air-tight by means of two sealing rings concentrically disposed therebetween, the sealing rings being provided with a groove extending therebetween with which an intake port communicates, whereby intake of the gas through the intake port is enabled.

BRIEF DESCRIPTION OF THE DRAWINGS

FIG. 3 shows a cross-sectional view of an explosion-proof valve employed in the embodiment;

FIG. 4 is a cross-sectional view of a view port employed in the embodiment;

DETAILED DESCRIPTION OF THE PREFERRED EMBODIMENT

A preferred embodiment of the invention will now be described in detail with reference to the drawings.

Figure 1:
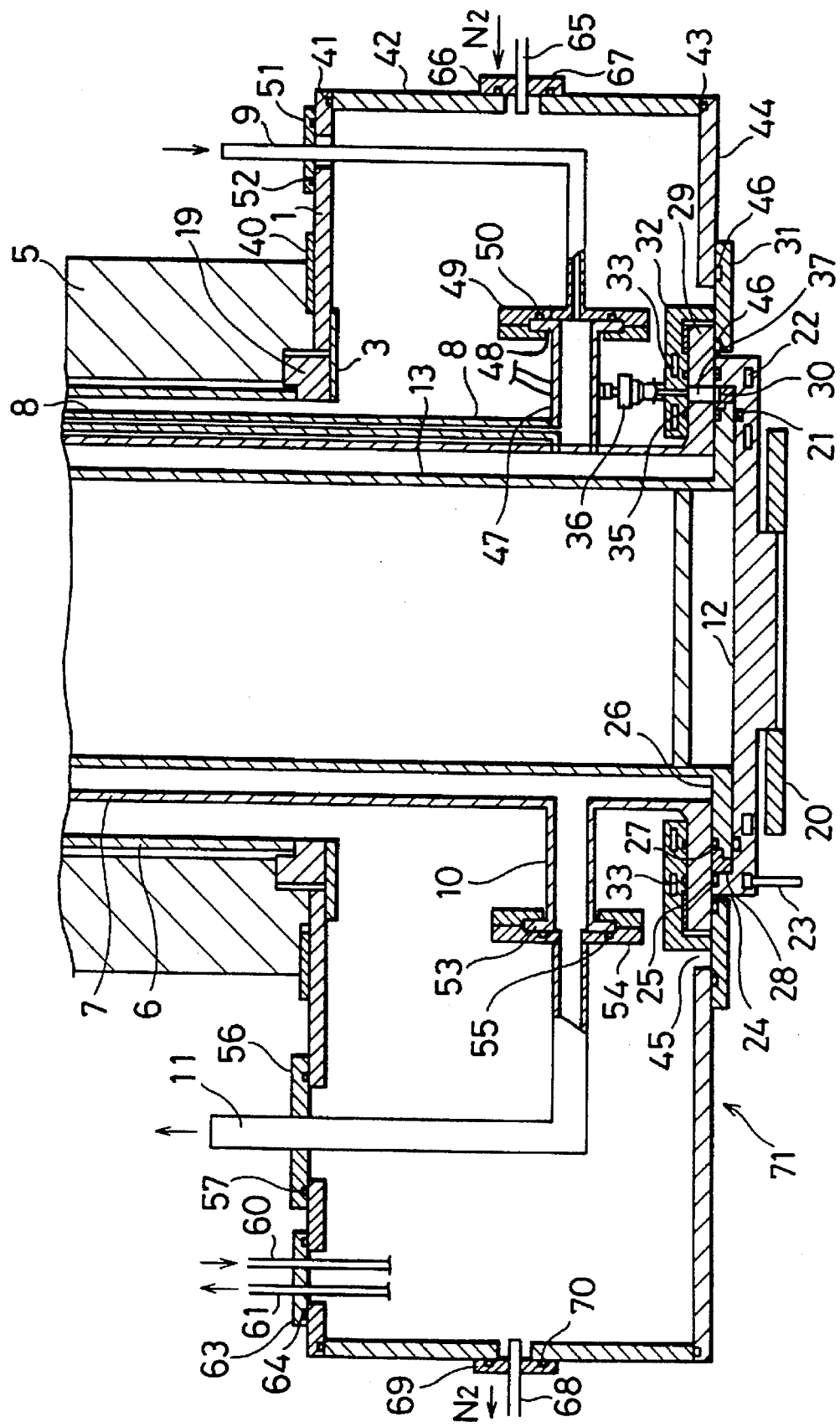
FIG. 1 is a cross-sectional view showing an embodiment of the present invention.
Figure 2:
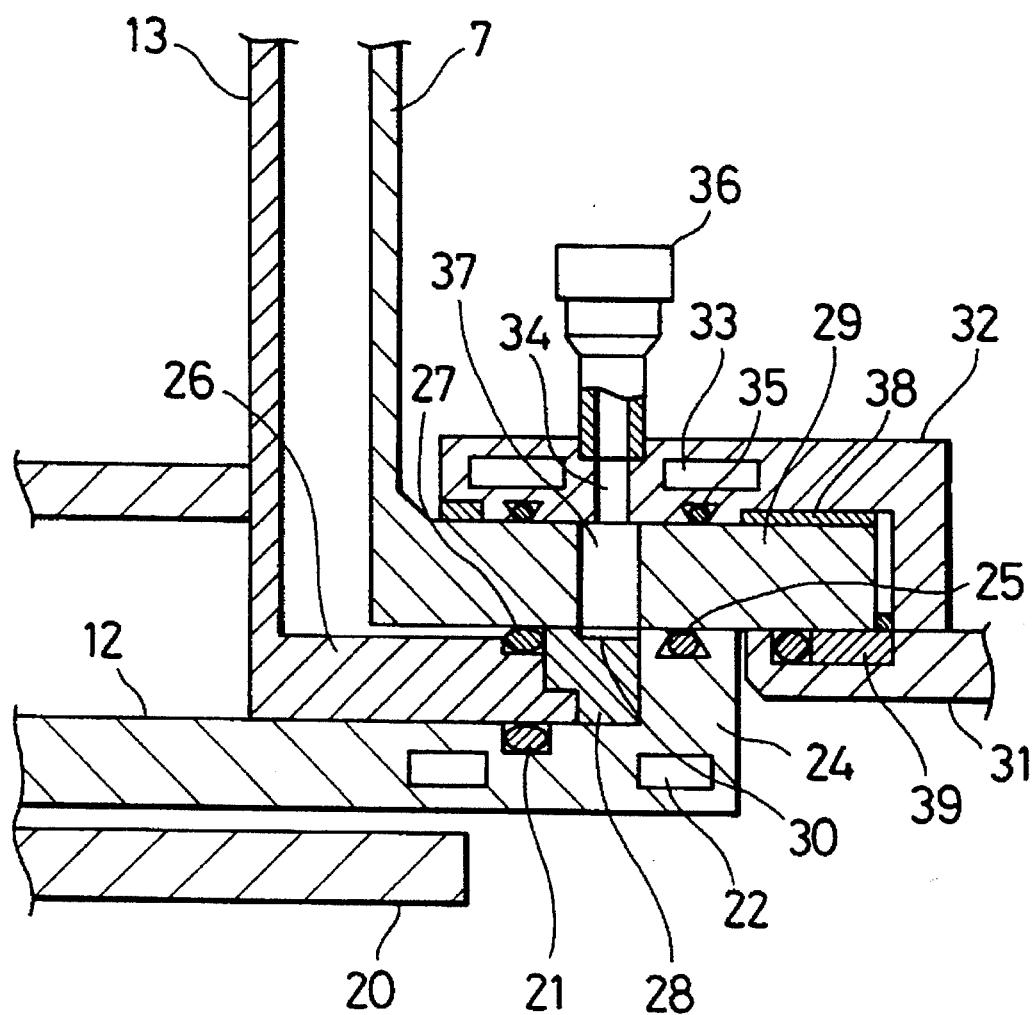
FIG. 2 is an enlarged view of the flange portion of a reaction tube employed in the embodiment.
Figure 6:
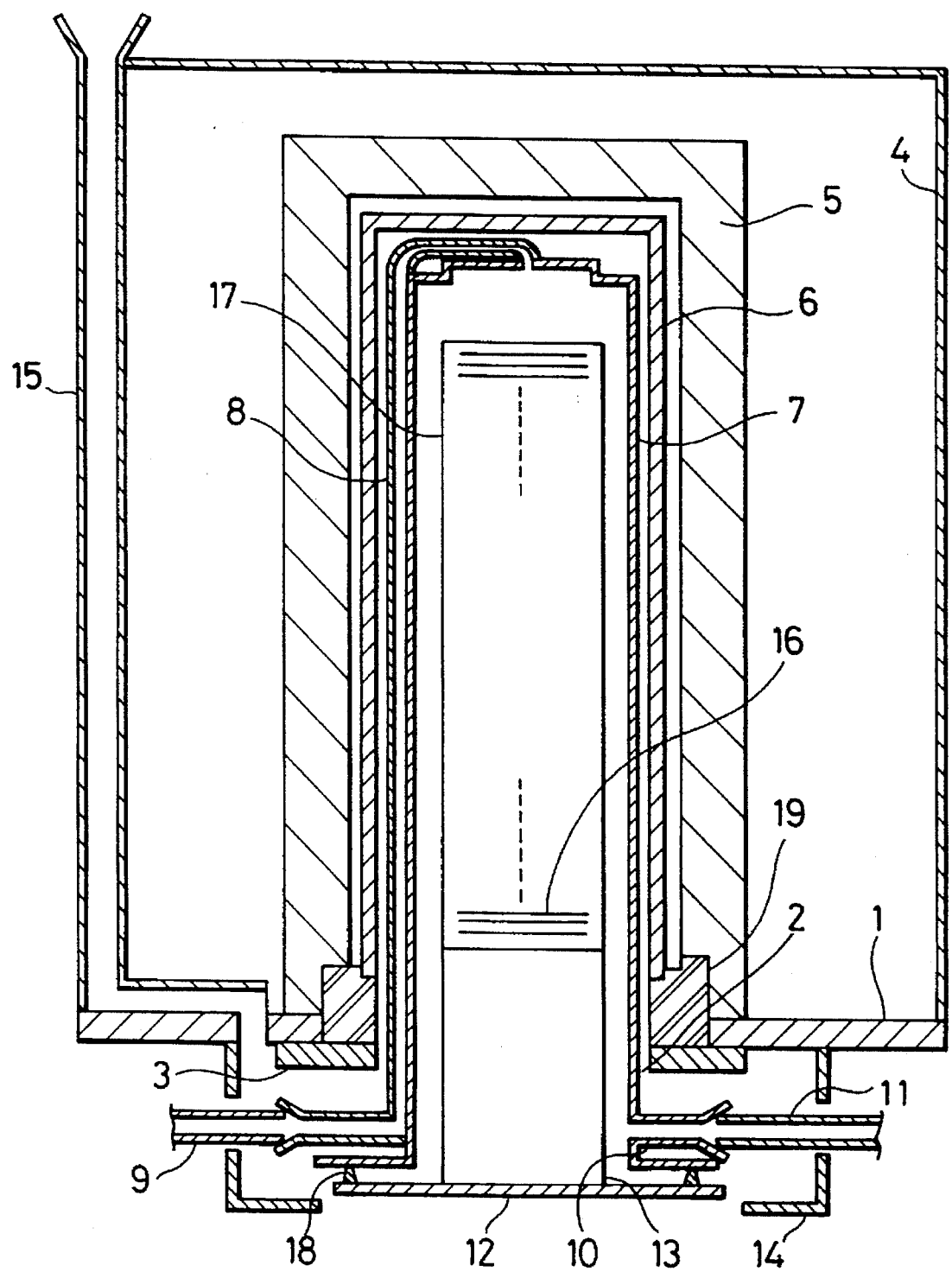
FIG. 6 is a view for explaining of a conventional assembly.

In FIGS. 1 and 2, like reference numerals will be used for corresponding parts shown in FIG. 6.

As shown in the figures, a fluorine rubber (FKM) packing 40 is interposed between the lower end of a heater 5 and a heater base 1. On the heater base 1, a liner tube 6 is vertically disposed via an annular seat 19. A reaction tube 7 is concentrically positioned within the liner tube 6 and extends vertically from a base plate 31 explained below.

Via a boat support jig 13, a boat 17 is introduced into the reaction tube 7. The boat support jig 13 is laid upon a seal cap 12, which is disposed on a boat elevator (not shown) via a boat support plate 20. A seal 21 is interposed between the seal cap 12 and the boat support jig 13. Within the seal cap 12, a cooling water passage 22 is formed proximately to the seal 21. The cooling water passage 22 is connected to a source of cooling water (not shown) via a cooling water port 23.

The seal cap 12 is flat and recessed in section with a ring-shaped bank 24 extending along circumferentially thereof. A seal ring 25 is received in a recess on the upper surface of the bank 24. A flange 26 of the boat support jig 13 is placed upon the seal cap 12 at its center. The flange 26 has two stepped portions at its edge. A steel ring 27 preferably is plugged into the upper one of the two stepped portions.

A flange secure ring 28 is sandwiched between the flange 26 and the bank 24 such that its upper part is matingly received in the lower step to thereby secure the boat support jig 13 against the seal cap 12. The internal surface of the upper part of the flange secure ring 28 is inwardly inclined. Thus, when the flange secure ring 28 is placed in a position with respect to the flange 26, the seal ring 27 is pressed inwardly by the top edge of the flange secure ring 28. At the outer edge of the upper surface of the flange secure ring 28, a stepped portion is formed for cooperating with a reaction tube flange 29 to form a ring-shaped seal groove 30.

The lower end of the reaction tube 7 extends downwardly beyond the heater base 1. The reaction tube flange 29 disposed at the lower end of the reaction tube 7 is seated at its peripheral edge upon a base plate 31. The connection between the reaction tube flange 29 and the base plate 31 is sealed by a sealing material 46. There is provided a space between the lower surface of the reaction tube flange 29 and the upper surface of the flange 26 so that an excess lead may not be applied to the flange 26.

The reaction tube flange 29 is securedly connected to the base plate 31 by a reaction tube secure ring 32. Within an inwardly projecting reaction tube secure portion of the reaction tube secure ring 32, two rows of cooling water passages 33 are juxtaposedly disposed, which are connected to a source of cooling water not illustrated. The reaction tube secure ring 32 includes at a position opposite from the cooling water passages a pair of seals 35 disposed astride intake apertures 34.

A predetermined number of the intake apertures 34 are disposed between the cooling water passages 33 and 33 and provided with respective intake ports 36, which are connected to a vacuum pump (not shown). The reaction tube flange 29 is provided at a position opposed to the intake aperture 34 with an aperture 37 communicating with the seal groove 30.

In the figures, reference numerals 38 and 39 refer to resilient members, such as a heat-insulating rubber, resin or like material for preventing an excess load from being applied to the reaction tube flange 29.

A cylindrical side wall 42 is connected air-tight at its upper end to the lower surface of the heater base 1 via a seal member 41. At its lower end, the side wall 42 carries a bottom plate 44 connected air-tight thereto via a seal member 43. The bottom plate 44 has a circular opening 45. In the vicinity of this opening 45, the base plate 31 is sealingly secured to the lower surface of the bottom plate 44 via a seal member 46. The side wall 42 and the bottom plate 44 should preferably be 5–10 mm in thickness so that they can withstand a pressure resulting from a possible internal explosion.

The reaction tube 7 has a reactive gas introduction nozzle 47 formed in communicating relation to the gas lead pipe 8. The reactive gas introduction nozzle 47 has a flange 48 joined with a flange 49 of the gas supply pipe 9 in sealed relation via a seal member 50. The gas supply pipe 9 extends through the heater base 1 of which hole allowing extension of the pipe 9 is sealingly covered by a flange 51 and a seal member 52. The exhaust nozzle 10 has a flange 53 which joined air-tight with a flange 54 of the exhaust pipe 11 via a seal member 55. The exhaust pipe 11 extends through the heater base 1 of which hole allowing extension is covered air-tight by a flange 56 and a seal member 57.

Also extending through the heater base 1 are a water supply pipe 60 in fluid communication with the cooling water passages 33 and a drainage pipe 61, to both of which a flange 63, secured air-tight to the heater base 1 by a seal member 64, is welded. Extending through the side wall 42 is an inert gas introduction pipe 65 with a flange 66 secured thereto by welding, the flange 66 being connected air-tight with the side wall 42 via a seal member 67. An inert gas exhaust pipe 68 also extends through the side wall 42. Similarly, the inert gas exhaust pipe 68 is secured in position by a flange 69 welded thereto which in turn is connected air-tight to the side wall 42 via a seal member 70.

Thus, the opening 45 is sealingly covered by the base plate 31, the reaction tube flange 29 and the seal cap 12, and a sealed space is defined by the heater base 1. The side wall 42 and the bottom plate 44 forms a scavenger 71 covering the furnace entry port.

Although not shown in FIG. 1, the heater base 1, the side wall 42 or the bottom plate 44 carries at an appropriate position an explosion-proof valve 73. With reference to FIG. 3, an explanation will now be made as regards an alternate embodiment in which the side wall 42 is provided with such explosion-proof valve 73.

The side wall 42 is provided with a venthole 74 around which at least two pins 75 are disposed for slidably supporting a valve member 76 thereon. The pins 75 also support a stopper plate 77 on their ends A compression spring 78 is provided with each of the pins 75 between the valve member 76 and the stopper plate 77 to outwardly urge the stopper plate 77 and the valve member 76. The pins 75 have threaded portions at their top ends for threaded engagement with mating internal threads of nuts 79. Each nut 79 carries a knob 80 rotatably disposed thereon. A seal member 81 is interposed between the side wall 42 and the valve member 76 to produce a sealed connection therebetween. The resilient force of the compression spring 78 is adjusted, by rotating the knob 80 to move the nuts 79 a predetermined amount axially, so that separation of the valve member 76 from the side wall 42 is allowed when the scavenger 71 has an internal pressure of 0.1–0.5 kg/cm$^2$.

A view port for viewing the inside of the scavenger is disposed at an appropriate position of the heater base 1, the side wall 42 or the bottom plate 44. FIG. 4 shows a view port 83 disposed on the side wall 42. The side wall 42 has a window opening 84 in which a pressure-resistant glass 85 is fit and secure by means of flanges 87 which in turn are secured by bolts 88. The pressure-resistant glass 85 and the side wall 42 are sealed by interposing a seal member 86.

Figure 5:
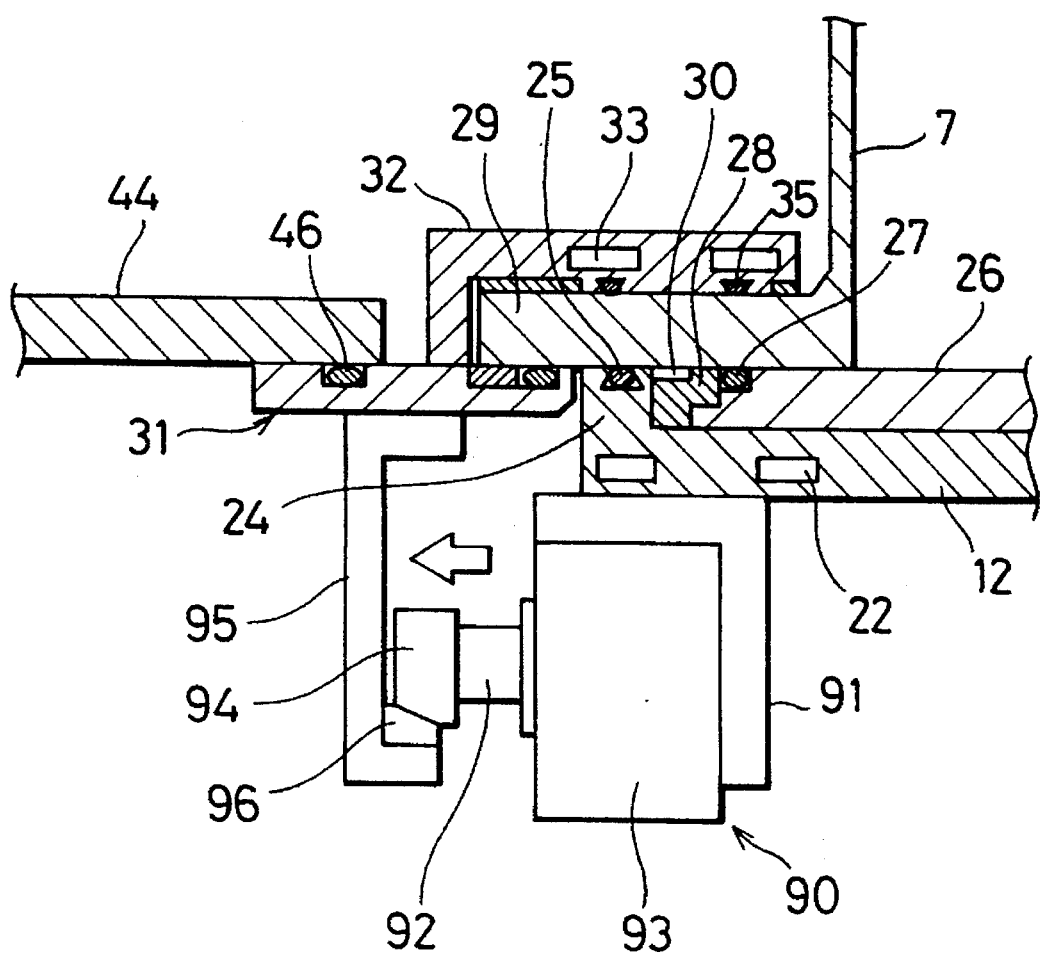
FIG. 5 is a side elevational view of a lock mechanism employed in the embodiment.

To produce an improved sealing effect between the seal cap 12 and the reaction tube flange 29, it is preferable to provide a lock mechanism 90 at two symmetrically separated positions, or three equidistantly separated, along the periphery of the seal cap 12. The lock mechanism 90 will now be explained with reference to FIG. 5.

At its peripheral edge, the seal cap 12 has a cylinder retainer 91, to which a lock cylinder 93 with an outwardly projectable rod 92 is mounted. At its top end, the rod 92 has a clamp block 94 secured thereto, which is made of a synthetic resin, preferably a heat-resistant fluoride resin. The lower surface of the clamp block 94 is inwardly inclined or tapered toward the top end thereof.

At a position opposite from the lock cylinder 93 of the base plate 31, there is provided a bracket 95 which includes a clamp acceptor 96 engageable with the inclined lower surface of the clamp block 94. The clamp acceptor 96 may be formed of a heat-resistant synthetic resin, such as preferably a heat-resistant fluoride resin. Either the clamp block 94 or the clamp acceptor 96 may be formed of metal.

The operation of the inventive arrangement will now be described.

The boat (not shown) is inserted into and pulled out of the reaction tube 7 by upwardly and downwardly moving the seal cap 12 by use of a boat elevator not shown. When insertion of the boat is completed, the bank 24 of the seal cap 12 abuts against the reaction tube flange 29, and the seal rings 25 and 27 closely contact the reaction tube flange 29. At this time, since the opening of the reaction tube is closed directly by the boat support jig 13, there are no metal members extending into the reaction chamber and hence it is not necessary to consider metal corrosion by the reactive gas. Further, since all exposed to the inside of the reaction tube are quartz surfaces, metal contamination of the wafer can be avoided.

The lock mechanism 90 is operated. The lock cylinder 93 is then operated to cause the rod 92 to project for engaging the clamp block 94 with the clamp acceptor 96. By virtue of the wedge action produced by the clamp block 94 and the clamp acceptor 96, the bank 24 tightly contacts with the reaction tube flange 29 and the seal cap 12 is firmly pressed against the bottom plate 44. Since there is formed a gap between the flange 26 and the reaction tube flange 29, as explained above, an excess load will not be operated upon the flange 26 as a result of clamping the seal cap 12 by the lock mechanism 90 and hence damaging of the boat support jig 13 will not arise.

Thus, the lower connected surface of the reaction tube flange 29 is dually sealed by means of the seal rings 25 and 27. Similarly, the upper connected surface of the reaction tube flange 29 is dually sealed by the seal 35. Also, the reaction tube 7 is sealed internally and externally by the seal 21 and the seal member 46. Further, vacuum pumping through the intake ports 36 will place the area defined by the aperture 37, seal groove 30, the seal rings 25 and 27, the seal 21 and the seal 35 at a negative pressure, and this will prevent the gas from leaking out from the reaction tube 7, whereby the sealing effect is further enhanced.

Cooling water is fed through the cooling water passage 33 via the water supply pipe 60 and the drainage pipe 61 so as to cool down the seal 35. The cooling water is also fed through the cooling water passage 22 via the cooling water port 23 so as to cool down the seal 21 and seal ring 25.

The reactive gas is introduced into the reaction tube 7 from the gas supply pipe 9 through the reactive gas introduction nozzle 47 and the gas lead pipe 8. After reaction, the gas is exhausted from the exhaust pipe 11 via the exhaust nozzle 10. The gas supply pipe 9 and the reactive gas introduction nozzle 47 are the composite joined together at their flanges 48 and 49 with the seal 50 sandwiched therebetween. The exhaust nozzle 10 and the exhaust pipe 11 are also joined together air-tight by means of the seal member 55 sandwiched therebetween and hence a sealed joint is obtained, whereby gas leakage from the joints present in the gas transmission system leading to the reactive gas reaction tube 7 can be avoided.

The furnace entry port of the reaction tube 7, the joined portion of the gas supply pipe 9 and the joined portion of the exhaust pipe 11 are all received within the scavenger 71, and the scavenger is completely sealed. As a result, the gas, by any chance leaked internally, will not leak out from the scavenger 71. It is preferable to provide an inert gas introduction pipe 65 and an inert gas exhaust pipe 68 so that an inert gas such as nitrogen gas may be introduced through the inert gas introduction pipe 65 and exhausted through the inert gas exhaust pipe 68 to thereby dilute any leaked reactive gas with the inert gas so as to lower the concentration of the reactive gas, ensuring security.

Where the reactive gas is chosen to be hydrogen gas, introduction of nitrogen gas will reduce the oxygen concentration to less than 100 ppm, thereby avoiding a possible explosion if the hydrogen gas by any chance leaked. Where the reactive gas is a strong acid gas as a fluorine gas, the reactive gas is diluted and hence its reactivity is weakened, thus avoiding corrosion of the metal components.

When a hydrogen gas explosion occurred within the scavenger 71 and the internal pressure goes up, the pressure will be acted upon the valve member 76. As a result, the valve member 76 will caused by the outwardly directed pressure to move away from the side wall 42 against the resilient force of the compression spring 78, causing the gas to be exhausted from the scavenger 71. Consequently, the furnace components can be protected from being damaged by an explosion within the scavenger 71.

Since an operator can look into the inside of the arrangement from the view port 83 through the pressure-resistant glass 85, internal inspection and monitoring can easily be performed. It is also possible to find out about any internal accident immediately as it occurs.

The inert gas introduction pipe 65 and the inert gas exhaust pipe 68 are disposed on the side wall 42. Alternatively, they may be disposed on the heater base 1 so that the pipe system can be concentrated upon the heater base 1, enabling simplification of the piping system and space saving. It should also be understood that although the embodiment has been explained as applied to a vertical furnace, and it is needless to say it is applicable to a horizontal furnace.

As thus far explained, according to the present invention, the reaction tube can be sealed completely. As a result, it is possible to prevent diffusion of any gas leaked from the reaction tube and this enables use of a strong acid gas such as a highly reactive hydrogen gas and a fluorine gas as a reactive gas. Since the pressure-resistant scavenger is designed to sealingly enclose the outer peripheral portion, extending beyond the heater, of the reaction tube, any gas leaked from the reaction tube can be collected locally and processed safely by introducing the inert gas and exhausting the same. Also, by virtue of the explosion-proof valve, the pressure resulting from an explosion will be allowed to escape and this will protect quartz components from being damaged by an explosion, if possible, of the hydrogen gas leaked. Further, by the disposition of the transparent glass on the pressure-resistant scavenger, the inside of the scavenger can be viewed, producing improved efficiency in operation. Moreover, by providing the dual seals at the seal cap portion and introducing and exhausting the gas, leakage of the gas from the sealed portions of the seal cap and the reaction tube can be avoided. By providing the seal cap with the lock mechanism, the sealing is ensured and can endure shocks of a certain level.

What we claim are:

1. A thermal treatment furnace for use with a semiconductor production system, comprising:

a heater base:

a heater disposed on the heater base;

a reaction tube disposed partially within the heater, the reaction tube having a lower end extending out of the heater; and a scavenger sealingly enclosing the periphery of the lower end of the reaction tube.

2. The thermal treatment furnace as in claim 1 wherein:

the heater is vertically disposed on a heater base, the reaction tube is disposed within the heater, and the scavenger is disposed below the heater base and sealingly covers the lower end of the reaction tube, the thermal treatment furnace further including;

a gas supply pipe connected to the lower end of the reaction tube at a first junction: and an exhaust pipe connected to the lower end of the reaction tube at a second junction; and projecting beyond the heater;

wherein the scavenger sealingly encloses the first and second junctions.

3. The thermal treatment furnace as in claim 2 in which it further includes a boat support jig on which a boat for supporting a wafer thereon is disposed vertically, the boat support jig covering an opening of the reaction tube air-tight.

4. The thermal treatment furnace as in claim 1 in which it further includes a gas supply pipe extending through the reaction tube and an exhaust pipe communicating with the reaction tube and extending through the heater base respectively, the openings through which they extend being sealed.

5. The thermal treatment furnace as in claim 1 or 2 in which it further includes a reactive gas supply pipe having a flange at its top end, a reactive gas introduction nozzle, disposed closely to the reaction tube, having a flange, the two flanges being joined together in an air-tight fashion by means of a seal member sandwiched therebetween, an exhaust pipe having a flange at its top end, and an exhaust nozzle, disposed closely to the reaction tube, having a flange, the latter two flanges being joined together in an air-tight fashion by means of a seal member sandwiched therebetween.

6. The thermal treatment furnace as in claim 1 or 2 wherein an inert gas is supplied through a first position on the scavenger and exhausted through a different position.

7. The thermal treatment furnace as in claim 1 or 2 in which the scavenger includes an explosion-proof valve disposed thereon.

8. The thermal treatment furnace as in claim 1 or 2 in which the scavenger includes a view port disposed thereon.

9. The thermal treatment furnace as in claim 2 in which it further includes at least two pairs of lock mechanisms disposed in the vicinity of a sealing cap which closes the the opening of the reaction tube.

10. The thermal treatment furnace as in claim 2 or 3 in which the reaction tube includes flanges formed at its entry port side edge, which are joined together in an air-tight fashion by means of two seal rings concentrically disposed therebetween, the seal rings being provided with a groove extending therebetween with which an intake port communicates, whereby intake of the gas through the intake port is enabled.

* * * * *